US006365426B1

(12) United States Patent
Cheung et al.

(10) Patent No.: US 6,365,426 B1
(45) Date of Patent: Apr. 2, 2002

(54) METHOD OF DETERMINING THE IMPACT OF PLASMA-CHARGING DAMAGE ON YIELD AND RELIABILITY IN SUBMICRON INTEGRATED CIRCUITS

(75) Inventors: Kin P. Cheung, Hoboken, NJ (US); Philip W. Mason, Kissimmee, FL (US)

(73) Assignee: Agere Systems Guardian Corporation, Orlando, FL (US)

( * ) Notice: Subject to any disclaimer, the term of this patent is extended or adjusted under 35 U.S.C. 154(b) by 0 days.

(21) Appl. No.: 09/560,935

(22) Filed: Apr. 30, 2000

Related U.S. Application Data

(60) Provisional application No. 60/141,348, filed on Jun. 28, 1999.

(51) Int. Cl.[7] ............................................. H01L 21/66
(52) U.S. Cl. ..................... 438/17; 438/199; 324/769
(58) Field of Search ............................ 438/17, 14, 199, 438/202, 203; 324/769

(56) References Cited

U.S. PATENT DOCUMENTS

| | | | |
|---|---|---|---|
| 5,594,328 A | * | 1/1997 | Lukaszek |
| 5,638,006 A | * | 6/1997 | Nariani et al. |
| 5,650,336 A | * | 7/1997 | Eriguchi et al. |
| 5,844,300 A | * | 12/1998 | Alavi et al. |
| 6,028,324 A | * | 2/2000 | Su et al. |

OTHER PUBLICATIONS

Jack C. Lee, Ih–Chin Chen, and Chenming Hu, "Modeling and Characterization of Gate Oxide Reliability," IEEE Transactions on Electron Devices, vol. 35, No. 12, pp. 2268–2278, Dec. 1988.*

Subhash R. Nariani and Calvin T. Gabriel, "A Simple Wafer–Level Measurement Technique for Predicting Oxide Reliability," IEEE Electron Device Letters, vol. 16, No. 6, pp. 242–244, Jun. 1995.*

Koji Eriguchi and Yukiharu Uraoka, "New Method for Lifetime Evaluation of Gate Oxide Damaged by Plasma Processing," IEEE Electron Device Letters, vol. 16, No. 5, pp. 187–189, May 1995.*

Koji Eriguchi and Masaaki Niwa, "Correlation Between Lifetime, Temperature, and Electrical Stress for Gate Oxide Lifetime Testing," IEEE Electron Device Letters, vol. 18, No. 12, pp. 577–579, Dec. 1997.*

* cited by examiner

Primary Examiner—Charles Bowers
Assistant Examiner—Stephen W. Smoot

(57) ABSTRACT

The present invention provides a method of determining a reliability of a semiconductor device. In an exemplary embodiment, the method determines an oxide stress voltage as a function of an antenna ratio of a semiconductor device, determines an oxide area of the semiconductor device and determines a failure fraction of the semiconductor device as a function of the oxide stress voltage and the oxide area.

15 Claims, 5 Drawing Sheets

METHOD OF DETERMINING THE IMPACT OF PLASMA-CHARGING DAMAGE ON YIELD AND RELIABILITY IN SUBMICRON INTEGRATED CIRCUITS

CROSS-REFERENCE TO PROVISIONAL APPLICATION

This application claims the benefit of U.S. Provisional Application No. 60/141,348 entitled "QUANTITATIVE YIELD AND RELIABILITY PROJECTION FROM ANTENNA TEST RESULTS," to K. P. Cheung, et. al., filed on Jun. 28, 1999, which is commonly assigned with the present invention and incorporated herein by reference as if reproduced herein in its entirety.

TECHNICAL FIELD OF THE INVENTION

The present invention is directed, in general, to a method of determining the yield and reliability of a semiconductor device and, more specifically, to a method of determining the yield and reliability of a semiconductor device with respect to an antenna ratio and an oxide area of the semiconductor device.

BACKGROUND OF THE INVENTION

As is well known, an increasing number of metal and dielectric interconnect levels are currently being added to semiconductor devices manufactured today. The increasing number of levels allow the semiconductor manufacturing industry the flexibility to maintain superior device speed while saving semiconductor wafer real estate. Using an increasing number of levels introduces additional processing steps, including manufacturing metal layers and interconnects to connect such additional levels. Moreover, the increasing number of processing steps use plasma sources that are necessary to create very small, high aspect ratio features. Also, gate oxides are becoming thinner to accommodate a decrease in the size of integrated circuits (ICs) in general, and provide for faster operating speeds of these devices. Due to the increased number of levels and processing steps, the IC devices are subjected to an increased amount of plasma charging during interconnect formation. This has caused problems with the thinner gate oxides associated with today's IC devices because these thinner gate oxides are highly susceptible to plasma charging damage.

Plasma charging damage typically occurs during metal etch, dielectric deposition, window etch or other processes used when manufacturing a semiconductor device. The damage results when ions and electrons introduced by the plasma process, continually bombard the surface of a metal structure that is electrically connected to a transistor device. The plasma ions and electrons force a current through the thin gate oxide by way of conductive metal structures connected electrically to the gate oxides. If enough charge is transported through the oxide, the operational lifetime of the device can be reduced significantly or the device may even fail during the charging process itself.

It is commonly known in the industry that the amount of damage to a gate oxide, scales with the size of the metal antenna (antenna ratio) connected to the gate oxide. An antenna ratio is, as one having skill in the art already knows, the effective metal area exposed to the plasma divided by the gate oxide area. The semiconductor industry generally uses this knowledge, coupled with tests performed on extremely large antenna ratio testers, to set antenna rules on the product design. Thereafter, the device is manufactured according to the antenna ratio design rules that will minimize the amount of plasma damage to the gate oxide. However, even though it may be determined from the large antenna ratio testers how much plasma damage to the gate oxide might occur within the test device, it is not presently known how to predict from these tests how much damage occurs to the actual product during the manufacturing process. Without the ability to predict the damage impact on the completed product, and hence to quantitatively establish antenna design rules, the only way to ensure product reliability is to reduce the process damage as much as possible, and simultaneously, but arbitrarily, use as tight of design rules as possible.

Accordingly, what is needed in the art is a method of quantitatively predicting the yield and reliability projections for a generic IC product from antenna test results, which does not experience the problems associated with the prior art methods.

SUMMARY OF THE INVENTION

To address the above-discussed deficiencies of the prior art, the present invention provides a method of determining a reliability of a semiconductor device. In an exemplary embodiment, the method determines an oxide stress voltage as a function of an antenna ratio of a semiconductor device, determines an oxide area of the semiconductor device and determines a failure fraction of the semiconductor device as a function of the oxide stress voltage and the oxide area.

BRIEF DESCRIPTION OF THE DRAWINGS

For a more complete understanding of the present invention, reference is now made to the following descriptions taken in conjunction with the accompanying drawings, in which.

DETAILED DESCRIPTION

The present invention is directed to a method of determining a reliability or yield of a semiconductor device, and more specifically a method of determining a reliability or yield of a semiconductor device having plasma damage. It is well established that large oxide areas have a shorter wear out lifetime, when subjected to the same stress voltage, as smaller oxide areas. The present invention uses this lifetime dependence on area, in conjunction with the development of a relationship between the oxide stress voltage during processing and an antenna ratio, to determine the reliability of a semiconductor device having plasma damage. Moreover, the relationship may be used to manufacture a semiconductor device not as susceptible to plasma damage.

Figure 1:
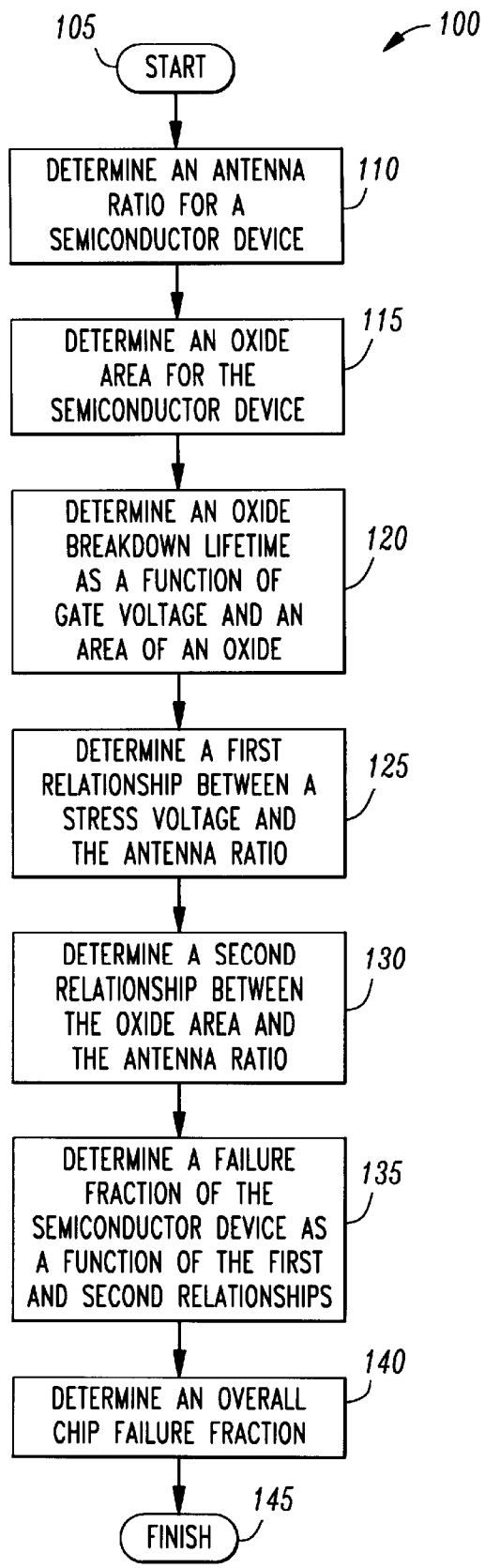
FIG. 1 illustrates a flow diagram of a method of determining a reliability of a semiconductor device.

Referring initially to FIG. 1, illustrated is a flow diagram 100 of a method of determining a reliability of a semiconductor device, such as an integrated circuit. In FIG. 1, the system first performs initialization in step 105. After initialization, in step 110 an antenna ratio or antenna ratio distribution for a semiconductor device is determined. Those who are skilled in the art are familiar with how to determine the antenna ratio for a given semiconductor device. An oxide area for the semiconductor device may be determined in a step 115. The oxide area is the area in a transistor device where the thin oxide, or gate oxide, is in direct physical contact with a gate.

Figure 2:
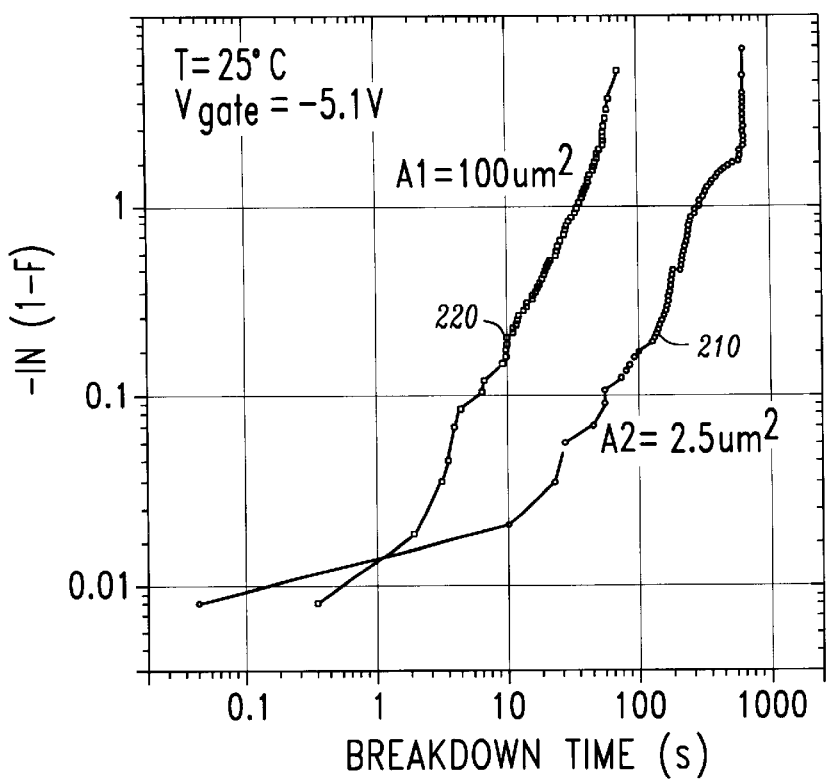
FIG. 2 illustrates a graph representing the oxide breakdown lifetime distribution.

An oxide breakdown lifetime as a function of a gate voltage and the oxide area, may be determined in a step 120. The breakdown lifetime represents the intrinsic reliability characterization of the oxide area, i.e., a device that has received no charging damage. Turning to FIG. 2, illustrated is a graph 200 representing the oxide breakdown distribution. Each circle 210 represents an identical structure having a gate area of 2.5 $\mu m^2$ and a fixed antenna ratio. Likewise, each square 220 represent an identical structure having a gate area of 100 $\mu m^2$ and also having a fixed antenna ratio. Therefore, the graph 200 shows that statistically there is a variation in the oxide lifetime for a given structure and applying a given voltage.

Figure 3:
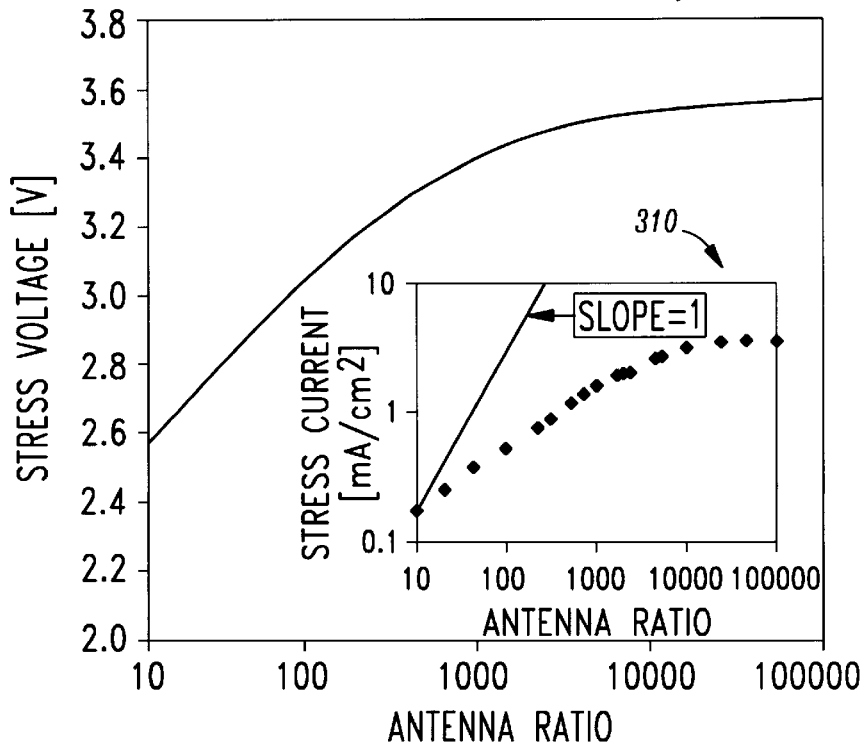
FIG. 3 illustrates a graph representing the failure fraction of semiconductor devices having various antenna ratios and having various oxide areas.
Figure 4:
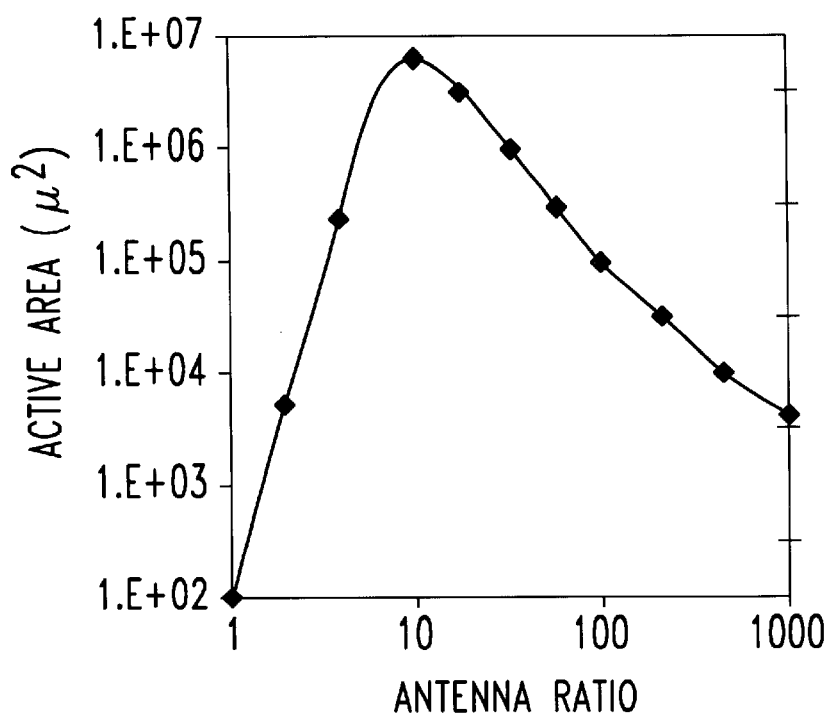
FIG. 4 illustrates a graph that shows the relationship of stress voltage as a function of antenna ratio for the semiconductor device.

After determining the oxide breakdown lifetime in step 120, a measurement should be made of the yield of an antenna test structure, which may or may not have received plasma damage, in a step 125. Likewise, in a step 130, the measurement should then be repeated for several antenna ratios and oxide areas, as illustrated by the graph 300 shown in FIG. 3. Next, in a step 135, the stress conditions these devices are exposed to during processing may then be calculated. To do this, well known charge balance equations for plasma charging are applied to the graph 300 to determine the oxide stress voltage as a function of any antenna ratio, resulting in the graph 400 of FIG. 4. The graph 400 also illustrates that as the antenna ratio increases, i.e., from 10 to 100,000, the stress voltage increases. Also, inset within FIG. 4 is a graph 410 representing the stress current density as a function of antenna ratio.

Figure 5:
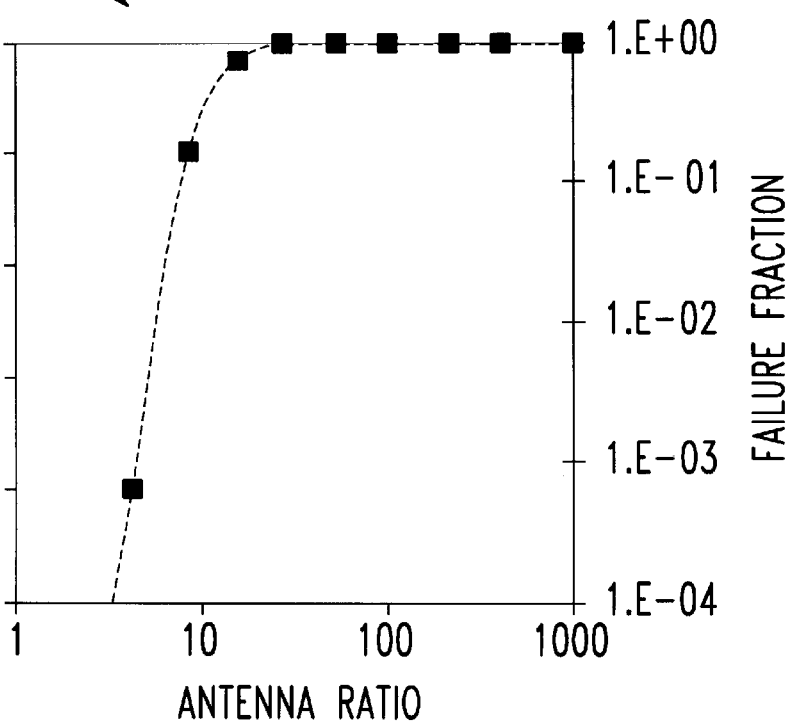
FIG. 5 illustrates a graph showing the relationship between oxide area and antenna ratio.

A relationship is then, in a step 140, determined between the oxide area and antenna ratio distribution of a semiconductor device. Referring to FIG. 5, illustrated is a graph 500 representing the relationship between the oxide area and the various antenna ratios. In one embodiment, the oxide areas are cumulative oxide areas. The cumulative oxide areas represent the total oxide area on a chip at a given antenna ratio.

Figure 6:
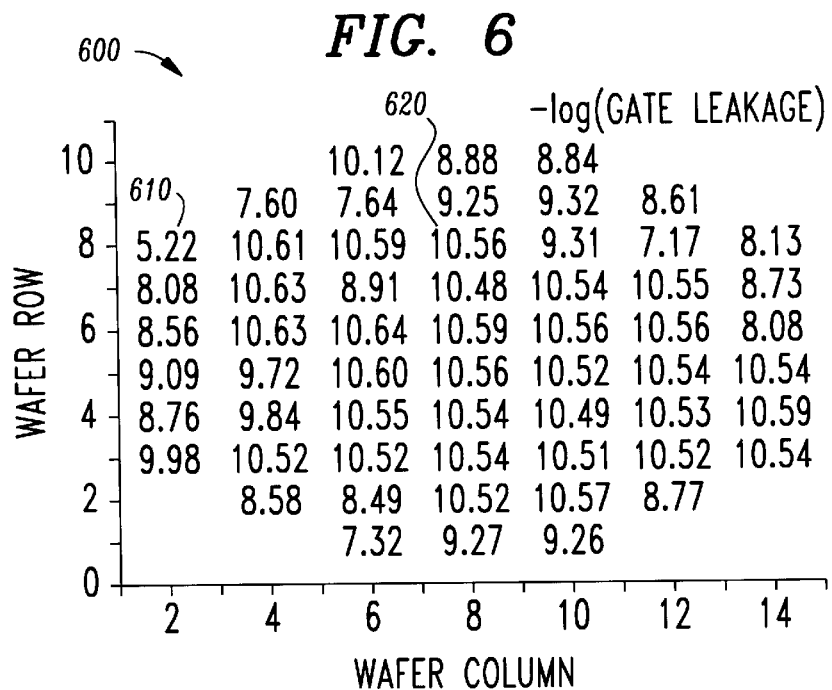
FIG. 6 illustrates a graph depicting the yield with respect to antenna ratio.

In a step 145, the relationship determined in step 140 is combined with the oxide stress voltage as a function of any antenna ratio as determined in step 135. What results is a determination of failure fraction of the semiconductor device as illustrated by graph 600 of FIG. 6. The graph 600, if desired, may then be used to determine an overall chip yield, in a step 150, and may be calculated by the equation:

$$\text{Yield} = \prod_i Y_i$$

wherein $Y_i$ is the yield of the $i^{th}$ device and $\Pi$ denoted taking the product for all devices. One having skill in the art knows that a semiconductor device may be an individual transistor having a single antenna ratio and gate oxide, or it may be an assembly of multiple transistors having a plurality of antennae and gate oxides. Thus, from the above method, the yield or reliability can be determined from the oxide area and the antenna ratio for a single semiconductor device, a plurality of semiconductor devices or for an entire semiconductor chip. Likewise, the oxide lifetime can be determined for a single or multiple sites on a semiconductor wafer.

The predicted yield or reliability metric can, in an optional step not illustrated, then be used to judiciously adjust a fabrication process parameter to improve the yield or reliability of an integrated circuit. Turning briefly back to FIG. 1, the method terminates in a step 155. One having skill in the art understands that the steps of the flow diagram 100 (FIG. 1) need not always be conducted in the order illustrated.

Figure 7:
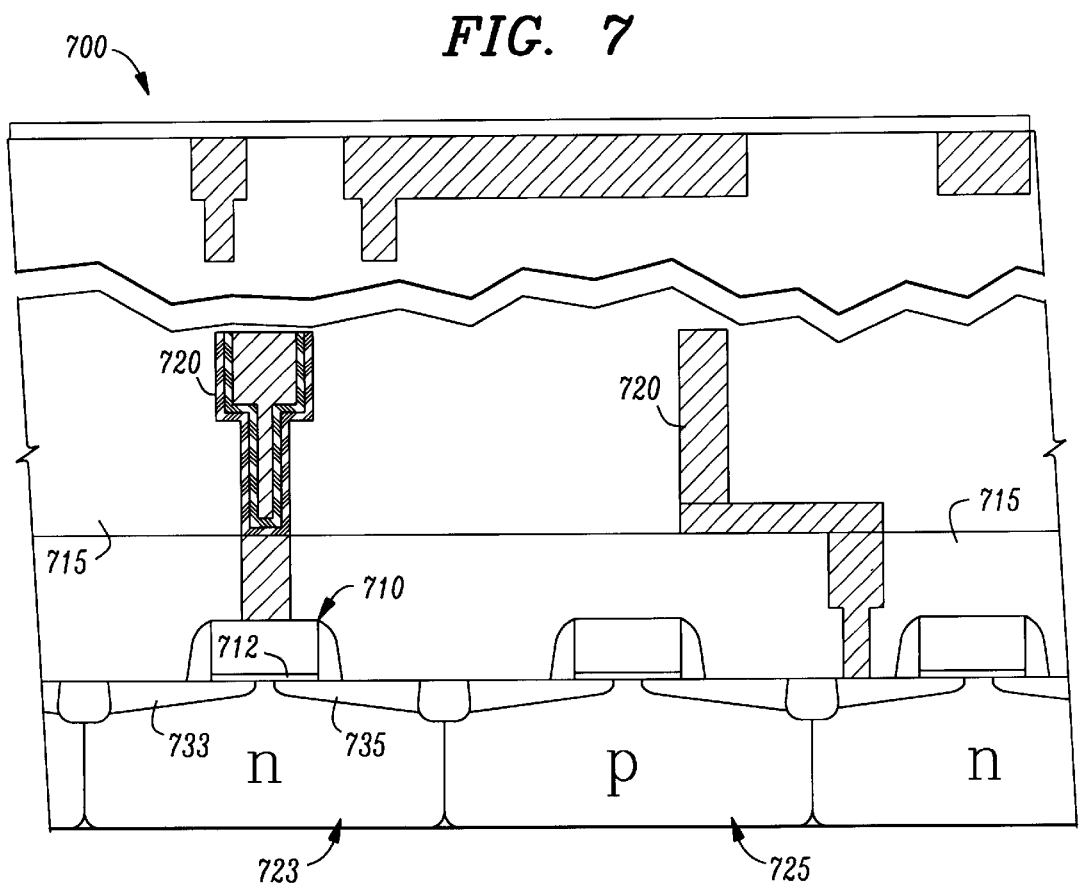
FIG. 7 illustrates a map of damage to antenna testers on a wafer, using increased gate-leakage current as a measure of damage.

So far, it has been assumed that the plasma damage is uniform across the wafer. However, quite often the damage is highly non-uniform. FIG. 7 illustrates an example of a damaged wafer map, using gate-leakage current as a measure. As illustrated, a large gate leakage 710 may be observed on the edge of the wafer, where minimal to no gate leakage 720 may be observed toward the middle of the wafer. In situations where non-uniformity occurs, statistical assessment of the plasma damage should be tested for each site independently. This requires using a large number of identically processed wafers to produce multiple test results for each site.

Figure 8:
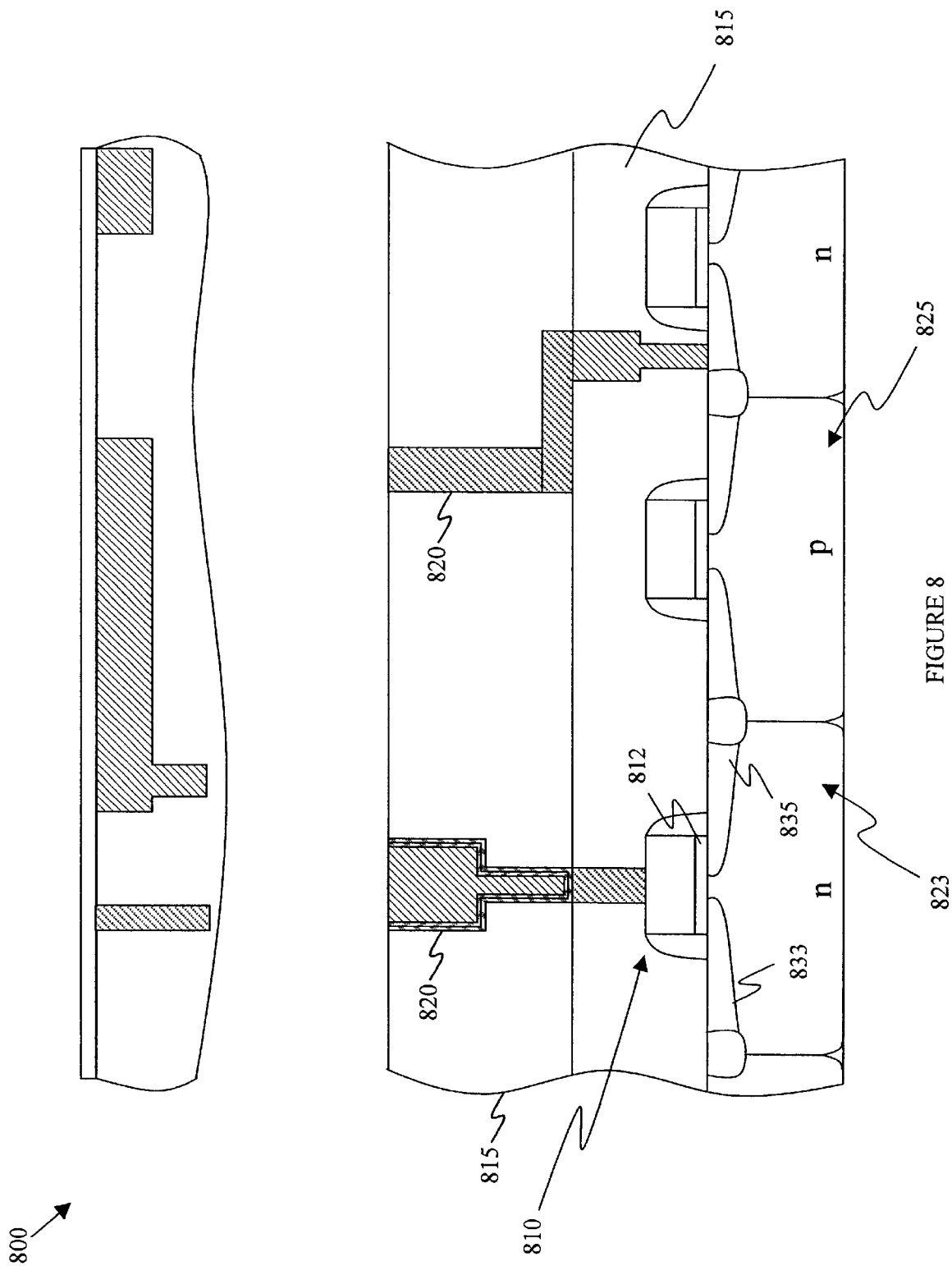
FIG. 8 illustrates a sectional view of a conventional integrated circuit, which might be manufactured according to the principles of the present invention.

Turning briefly to FIG. 8, there is illustrated a sectional view of a conventional integrated circuit 800 that might be manufactured according to the principles of the present invention. The integrated circuit 800 may be a CMOS device, a BiCMOS device, a Bipolar device or any other type of device. Also shown in FIG. 8, are components of the conventional integrated circuit 800, including: transistors 810, gate oxide 812, dielectric layers 815, in which interconnect structures 820 may be formed. The interconnect structures 820 connect the transistors 810 to other areas of the integrated circuit 800. Also illustrated, are conventionally formed tubs, 823, 825, source regions 833 and drain regions 835.

Although the present invention has been described in detail, those skilled in the art should understand that they can make various changes, substitutions and alterations herein without departing from the spirit and scope of the invention in its broadest form.

What is claimed is:

1. A method of determining an oxide lifetime of a semiconductor device, comprising:
   determining an oxide stress voltage as a function of an antenna ratio of a semiconductor device;
   determining an oxide area of the semiconductor device; and
   determining a failure fraction of the semiconductor device as a function of the oxide stress voltage and the oxide area.

2. The method as recited in claim 1 wherein determining an oxide stress voltage includes using antenna testers.

3. The method as recited in claim 1 further including determining a yield or reliability as a function of the oxide area and the antenna ratio.

4. The method as recited in claim 3 wherein determining a yield or reliability includes determining a yield or reliability of a plurality of semiconductor devices.

5. The method as recited in claim 4 further including determining the overall yield or reliability of a semiconductor chip.

6. The method as recited in claim 1 further including determining an oxide lifetime for multiple sites on a semiconductor wafer.

7. The method as recited in claim 1 wherein determining an oxide stress voltage includes determining a stress current density as a function of the antenna ratio.

8. A method of manufacturing an integrated circuit device, comprising:

forming transistors on a semiconductor substrate;

forming interconnect structures within dielectric levels to interconnect the transistors to form an integrated circuit;

determining a reliability of a semiconductor device, including:

determining an oxide stress voltage as a function of an antenna ratio of a semiconductor device;

determining an oxide area of the semiconductor device; and determining a failure fraction of the semiconductor device as a function of the oxide stress voltage and the oxide area; and adjusting a fabrication process parameter to improve the reliability of an integrated circuit.

9. The method as recited in claim 8 wherein determining an oxide stress voltage includes using antenna testers.

10. The method as recited in claim 8 further including determining an oxide lifetime for multiple sites on a semiconductor wafer.

11. The method as recited in claim 8 wherein determining an oxide stress voltage includes determining a stress current density as a function of the antenna ratio.

12. The method as recited in claim 8 wherein the integrated circuit may include a device selected from the group consisting of:

a CMOS device, a BiCMOS device, and a Bipolar device.

13. A method of manufacturing an integrated circuit device, comprising:

forming transistors on a semiconductor substrate;

forming interconnect structures within dielectric levels to interconnect the transistors to form an integrated circuit;

determining a reliability of a semiconductor device, including:

determining an oxide stress voltage as a function of an antenna ratio of a semiconductor device;

determining an oxide area of the semiconductor device;

determining a failure fraction of the semiconductor device as a function of the oxide stress voltage and the oxide area; and determining a yield or reliability as a function of the oxide area and the antenna ratio; and adjusting a fabrication process parameter to improve the reliability of said integrated circuit.

14. The method as recited in claim 13 wherein determining a yield or reliability includes determining a yield or reliability of a plurality of semiconductor devices.

15. The method as recited in claim 14 further including determining the overall yield or reliability of a semiconductor chip.

* * * * *